United States Patent [19]

Sugawara et al.

[11] Patent Number: 5,636,099
[45] Date of Patent: Jun. 3, 1997

[54] VARIABLE CAPACITOR FORMED BY MULTILAYER CIRCUIT BOARD

[75] Inventors: Hiroshi Sugawara; Fumikazu Harazono, both of Yokohama, Japan

[73] Assignee: Matsushita Electric Industrial Co., Ltd., Osaka, Japan

[21] Appl. No.: 444,918

[22] Filed: May 19, 1995

[30] Foreign Application Priority Data

May 31, 1994 [JP] Japan .................... 6-119310

[51] Int. Cl.⁶ .................. H01G 5/01; H01G 5/00
[52] U.S. Cl. .................. 361/278; 361/277; 361/280; 361/281; 361/763; 361/328
[58] Field of Search .................. 361/277, 298.4, 361/541, 540, 278–286, 761–766, 782, 792–795, 811; 174/255; 257/924

[56] References Cited

U.S. PATENT DOCUMENTS 2,903,633  9/1959  Cother .
4,342,143  8/1982  Jennings ...................... 29/25.42
4,494,100  1/1985  Stengel et al. ..................... 336/200
4,856,102  8/1989  Insetta .
5,225,969  7/1993  Takaya et al. ..................... 361/414
5,384,434  1/1995  Mandai et al. ..................... 174/258

*Primary Examiner*—Leo P. Picard
*Assistant Examiner*—Phuong T. Vu
*Attorney, Agent, or Firm*—Watson Cole Stevens Davis, P.L.L.C.

[57] ABSTRACT

A variable capacitor for a high frequency circuit of an electrical appliance includes a chip capacitor mounted on a multilayer circuit board and interdigital capacitors formed at inner layers of the circuit board. A wiring pattern for soldering the chip capacitor is connected with the interdigital capacitors via through holes formed in the circuit board. Capacitance select portions are cut so that the capacitance best-suited to the circuit is obtained. The through holes connected to the interdigital capacitors of the inner layer are selectively disconnected from the wiring pattern for soldering the chip capacitor, thereby obtaining a variable capacitor capable of absorbing fluctuations of the circuit for selecting the best-suited capacitance.

2 Claims, 2 Drawing Sheets

VARIABLE CAPACITOR FORMED BY MULTILAYER CIRCUIT BOARD

BACKGROUND OF THE INVENTION

1. Field of the Invention

The present invention relates to a variable capacitor used for a high frequency circuit of a high frequency apparatus, and more particularly to a variable capacitor formed by a multilayer circuit board.

2. Description of the Related Art

In recent years, a high frequency apparatus including a variable capacitor has been increasingly miniaturized, and is employed in portable personal communications devices. Along with this, the use environment of the high frequency apparatus is becoming increasingly severe. For example, the high frequency apparatus is often subjected to vibrations during use, shocks from being dropped and temperature changes due to an abrupt change in the use environment.

A conventional variable capacitor will now be described. FIGS. 1A to 1C are views each showing a typical structure of the conventional variable capacitor. FIG. 1A is a plan view, FIG. 1B is a cross-sectional view and FIG. 1C is a partially plan view. In FIGS. 1A to 1C, there are shown an adjusting pin 11, a rotor electrode 12, a stator electrode 13, a rotor 14 and an area 15 of a portion where the rotor electrode 12 and the stator electrode 13 are overlapped together with a dielectric substance.

The operation of the conventional variable capacitor configured as described above will be now be described. Firstly, the rotor 14 is so constructed as to move rotationally together with the adjusting pin 11. Next, the adjusting pin 11 is rotated to move the rotor electrode 12 installed in the rotor 14 to the position where it overlaps the stator electrode 13 to some extent. The capacitance of the variable capacitor is determined by the size of the area 15 of a portion where the rotor electrode 12 and the stator electrode 13 are overlapped together with a dielectric substance.

Thus, even in the conventional variable capacitor, the capacitance can be varied by rotating the adjusting pin 11.

However, since variation of capacitance depends on a mechanical adjustment, the above conventional variable capacitor has a problem that many failures in the mechanical portions thereof are generated by adding thereto vibrations during use shocks when the apparatus is dropped and hot and cold temperature cycles due to a use environment.

SUMMARY OF THE INVENTION

It is an object of the present invention to provide a small and a low cost variable capacitor having a long-term stable quality.

In order to attain the above object, the variable capacitor according to the present invention comprises a chip capacitor mounted on a multilayer circuit board; interdigital capacitors formed at inner layers of the multilayer circuit board; and conductive portions for connecting the chip capacitor with the interdigital capacitors. With the conductive portions, connection between the chip capacitor and the interdigital capacitors is interrupted, thereby making the capacitance variable.

According to the above construction, it is possible to realize a small and low cost variable capacitor in which there is no mechanical variable-capacitance structure, thereby stabilizing quality over the long term, and in which the variable portions are formed at the inner layers thereby mounting the chip capacitor alone on the surface of the substrate.

DESCRIPTION OF THE PREFERRED EMBODIMENTS

Figure 1A:
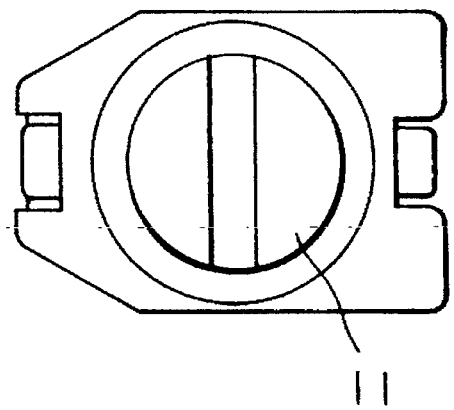
FIG. 1A is a plan view of the conventional variable capacitor.
Figure 1B:
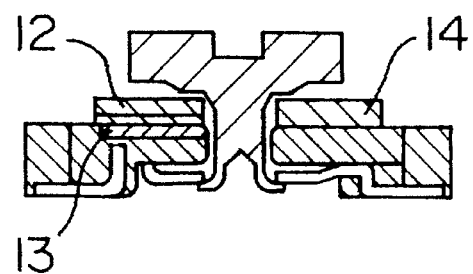
FIG. 1B is a cross-sectional view of the conventional variable capacitor.
Figure 1C:
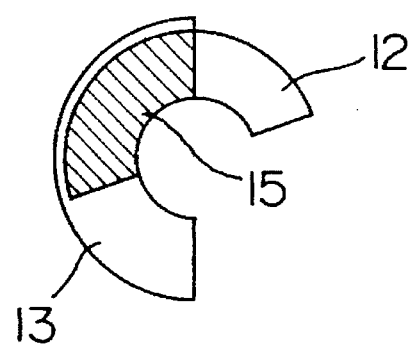
FIG. 1C is a plan view of a rotor electrode and a stator electrode.
Figure 2A:
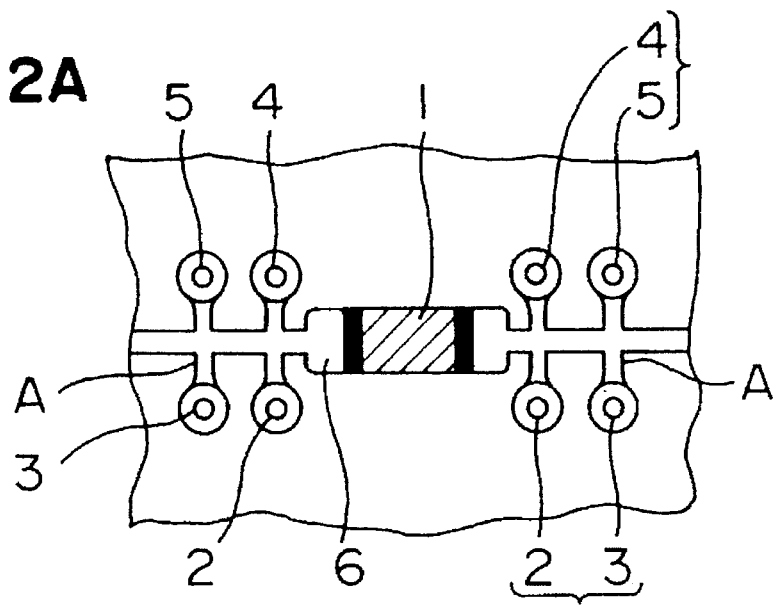
FIG. 2A is a plan view of a variable capacitor according to an embodiment of the present invention.
Figure 2B:
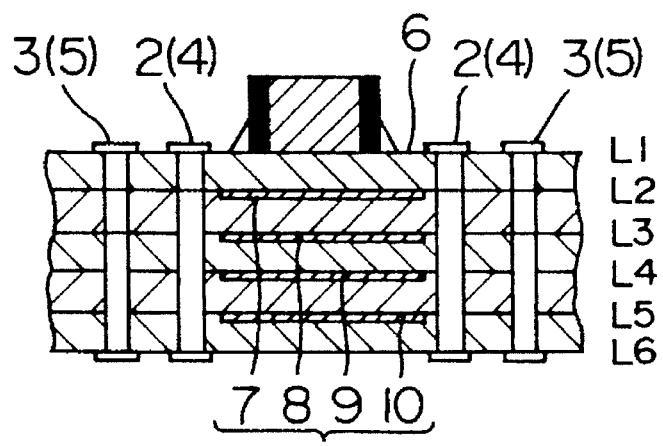
FIG. 2B is a cross-sectional view of a variable capacitor according to an embodiment of the present invention.
Figure 2C:
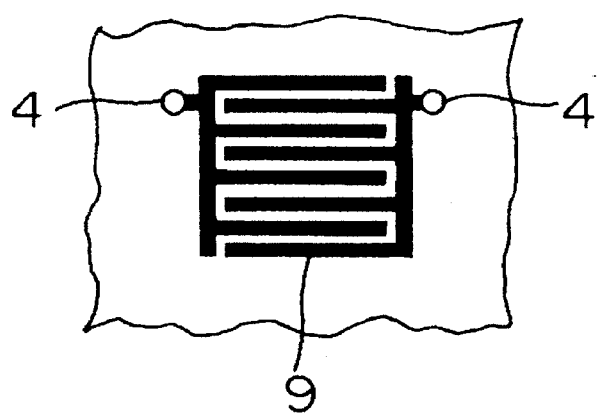
FIG. 2C is a plan view of an interdigital capacitor formed at the fourth layer of a variable capacitor according to an embodiment of the present invention.

An embodiment of the present invention will be described with reference to the accompanying drawings. FIG. 2A is a plan view showing the first layer of a circuit board of a six-layer (L1 to L6) structure, FIG. 2B is a cross-sectional view of FIG. 2A, and FIG. 2C is a view showing a specific pattern of an interdigital capacitor formed at the fourth layer. In FIGS. 2A to 2C, there are shown a chip capacitor 1, through holes 2 to 5 respectively connected to interdigital capacitors of the second to fifth layer, a wiring pattern 6 for soldering the chip capacitor 1, interdigital capacitors 7 to 10 formed at the second to fifth layers, respectively. The capacitor 7 is connected to the through hole 2, the capacitor 8 is connected to the through hole 3, the capacitor 9 is connected to the through hole 4 and the capacitor 10 is connected to the through-hole 5, respectively. These interdigital capacitors 7 to 10 are previously set so as to have a different capacity, respectively. Capacitance select portions A are formed on the wiring pattern 6 for causing disconnection between the through hole 3 and the capacitor 8.

When a variable capacitor having a configuration as described above is used for an actual circuit, an approximate constant range required for the circuit is firstly determined, and a lower limit value of the range is selected as the chip capacitor 1 and mounted. Next, in order to obtain a capacitance which optimizes characteristics of the circuit, the interdigital capacitors 7 to 10 formed at the inner layers are combined with each other so as to select a necessary inner layer and an unnecessary inner layer. In this embodiment, because the third layer is unnecessary, the capacitance select portions A are cut to disconnect the wiring pattern 6 for soldering the chip capacitor 1 from the interdigital capacitor 8 of the third layer, thereby obtaining a desired capacitance.

As described above, according to this embodiment, the set capacitance offers the following advantages. It is possible to realize a small and a low cost variable capacitor in which mechanical variable-capacitance structure is not included, thereby stabilizing quality over the long term, and in which the variable portions are formed at the inner layers thereby mounting the chip capacitor 1 alone on the surface of the substrate.

The total capacitance of the capacitor is expressed by the following equation:

$$L = L_1 + L_2 + L_3 + L_4 + L_5 + L_6$$

wherein L is a total capacitance of the capacitor, $L_1$ is a capacitance of the chip capacitor and $L_2$ to $L_6$ are capacitors of the interdigital capacitors of the second to sixth layers.

The desired capacitance can be obtained by cutting the patterns to remove each of the capacitances.

In the embodiment as described above, the desired capacitance is obtained by cutting the capacitance select portions A to disconnect the wiring pattern 6 for soldering the chip capacitor from the interdigital capacitor 8 of the third layer. Conversely, however, the desired capacitance may be obtained by disconnecting the wiring pattern 6 for soldering the chip capacitor 1 from all of the through holes 2 to 5 each connected to both ends of the interdigital capacitors formed at the inner layer without the aid of the conductive portions from the beginning, and then causing a short between the through holes (any one of 2 to 5) connected to both ends of the interdigital capacitor, which is necessary for obtaining optimal capacitance of the circuit, and the wiring pattern 6 for soldering the chip capacitor 1 with a connecting-bonding member such as a solder.

As described above, the variable capacitor according to the present invention comprises a chip capacitor mounted on a multilayer circuit board; interdigital capacitors formed on inner layers of the multilayer circuit board; and conductive portions for connecting the chip capacitor with the interdigital capacitor, and with the conductive portions, connection between the chip capacitor and the interdigital capacitors is interrupted, thereby making the capacitance variable. Therefore, it is possible to realize a small and a low cost variable capacitor having a long-term stable quality.

What is claimed is:

1. A variable capacitor formed on a multilayer circuit board, comprising:

a leadless chip capacitor mounted on a multilayer circuit board;

spaced interdigital capacitors formed at inner layers of said multilayer circuit board such that a dielectric material of said circuit board forms a dielectric layer between each of said spaced interdigital capacitors and said chip capacitor; and conductive portions formed on said circuit board so as to connect said chip capacitor with said interdigital capacitors, wherein said inner layers include through holes and said conductive portions are connected with said interdigital capacitors via said through holes formed at the inner layers and include respective capacitance select portions for causing selective disconnection between said chip capacitor and said interdigital capacitors.

2. A variable capacitor formed on a multilayer circuit board, comprising:

a leadless chip capacitor mounted on a multilayer circuit board;

patterns for said chip capacitor formed on said circuit board at both ends of said chip capacitor;

spaced interdigital capacitors formed at inner layers of said multilayer circuit board such that a dielectric material of said circuit board forms a dielectric layer between each of said spaced interdigital capacitors and said chip capacitor; and through holes for said interdigital capacitors formed in said circuit board at both ends of said interdigital capacitors; and a connecting-bonding member for connecting said patterns for said chip capacitor and said interdigital capacitors via said through holes, wherein said connecting-bonding member includes capacitance select portions for causing selective disconnection between said chip capacitor and said interdigital capacitors.

* * * * *